(12) United States Patent
Pritchett (10) Patent No.: US 7,075,796 B1
(45) Date of Patent: Jul. 11, 2006

(54) CAGE FOR PRINTED CIRCUIT BOARD

(75) Inventor: Robert L. Pritchett, Red Oak, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/111,623

(22) Filed: Apr. 21, 2005

(51) Int. Cl.
*H05K 5/02* (2006.01)
*H05K 7/20* (2006.01)

(52) U.S. Cl. ............... 361/796; 361/797; 361/798; 361/756; 211/41.17

(58) Field of Classification Search ............... 361/788, 361/796–798, 730, 752, 756; 211/41.17; 29/830
See application file for complete search history.

(56) References Cited

U.S. PATENT DOCUMENTS

| | | | | |
|---|---|---|---|---|
| 4,227,237 A * | 10/1980 | Matthews et al. | ......... | 361/797 |
| 4,652,969 A * | 3/1987 | Stegenga | ......... | 361/694 |
| 4,672,509 A * | 6/1987 | Speraw | ......... | 361/687 |
| 4,866,576 A * | 9/1989 | Umetsu et al. | ......... | 361/829 |
| 5,173,845 A * | 12/1992 | Shaw | ......... | 361/798 |
| 5,377,080 A * | 12/1994 | Lin | ......... | 361/756 |
| 5,388,995 A * | 2/1995 | Rudy et al. | ......... | 439/61 |
| 5,508,890 A * | 4/1996 | Hirata | ......... | 361/829 |
| 5,995,377 A * | 11/1999 | Tusler et al. | ......... | 361/796 |
| 6,175,507 B1 * | 1/2001 | Koradia et al. | ......... | 361/796 |
| 6,178,094 B1 * | 1/2001 | Hakozaki | ......... | 361/796 |
| 6,249,441 B1 * | 6/2001 | Barbier et al. | ......... | 361/796 |
| 6,256,205 B1 * | 7/2001 | Perry et al. | ......... | 361/753 |
| 6,580,616 B1 * | 6/2003 | Greenside et al. | ......... | 361/752 |
| 6,628,525 B1 * | 9/2003 | Miller et al. | ......... | 361/756 |
| 6,661,673 B1 * | 12/2003 | Brooks et al. | ......... | 361/756 |
| 6,765,803 B1 * | 7/2004 | Farnworth et al. | ......... | 361/796 |
| 2003/0099100 A1 | 5/2003 | Baker | | |
| 2003/0205541 A1 | 11/2003 | Greenside | | |
| 2004/0037054 A1 | 2/2004 | Ice | | |
| 2004/0100783 A1 | 5/2004 | Amit | | |
| 2004/0253842 A1 | 12/2004 | Barsun | | |
| 2005/0042893 A1 | 2/2005 | Debord | | |

\* cited by examiner

*Primary Examiner*—Kamand Cuneo
*Assistant Examiner*—Dameon E. Levi (57) ABSTRACT

Embodiments include apparatus, methods, and systems providing a cage for printed circuit boards. One exemplary embodiment provides a cage for housing plural printed circuit boards. The cage includes first and second side walls oppositely disposed and connected to a printed circuit board (PCB). Each side wall has plural guide mechanisms for receiving and guiding edges of plural PCBs into the cage. The cage further includes a front wall having a guide mechanism for receiving and slidingly engaging with the first and second side walls. The first, second, and front walls form an enclosure for housing the plural PCBs in a stacked configuration.

20 Claims, 7 Drawing Sheets

CAGE FOR PRINTED CIRCUIT BOARD

BACKGROUND

Many computer systems utilize a backplane, a circuit board into which other circuit boards or circuit cards connect. A single backplane can include various connectors to accommodate multiple different circuit cards. Some circuit cards are easily removable and plug-in to a connector on a surface of the backplane, and other circuit cards are more permanently mounted to the backplane.

Some computer systems utilize a card cage that encloses the backplane. Many card cages conform to predefined industry standards, such as the Compact Peripheral Component Interconnect (CPCI) standard or the Versa Modular Eurocard (VME) standard. These standards ensure that card cages have the same or similar designs. A CPCI card cage, for example, has four metal extrusions that are fixed or mounted to one side of the backplane.

Backplanes have limited area to accept circuit cards and other electronic components. In some instances, the size of a backplane must conform to standard form factors (i.e., manufacture established width to length ratios). Thus, designers endeavor to efficiently utilize space on the surfaces of the backplane to accommodate a large number of circuit cards and electronic components. Designs that utilize space more effectively decrease the size of the computer system and decrease manufacturing costs.

As another feature, circuit cards and other electronic components connected to the backplane are preferably easily accessible and readily removable. Construction and repair of a computer system is more complex and costly if components are difficult to service. For example, a single backplane can contain multiple circuit cards that are each individually secured to the backplane with screws or fasteners. If a tool is required to remove each circuit card, then servicing the backplane is labor intensive.

DETAILED DESCRIPTION

Figure 1:
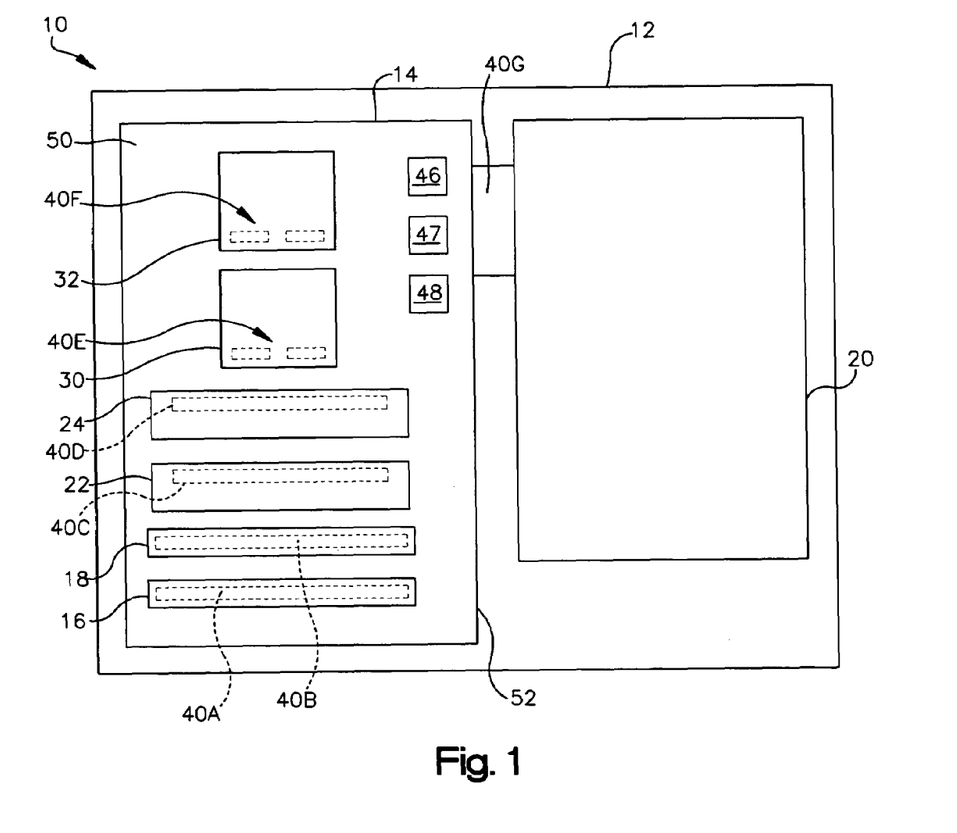
FIG. 1 is a plan view schematically illustrating an exemplary electronic system in accordance with the present invention.

FIG. 1 illustrates an exemplary electronic system, such as a computer system 10. Computer system 10 includes chassis 12, motherboard or backplane 14, plural printed circuit boards (PCBs) or daughterboards 16, 18, and 20, peripheral devices 22 and 24, and plural modular electrical systems 30 and 32 (described in more detail in FIGS. 2–8). Depending upon the particular type of the computer system 10 or its intended functions, the computer system 10 includes a greater or fewer number of modular electrical systems, PCBs, peripherals, etc. Further, in some embodiments, the computer system 10 includes alternative system components, heat generating components, and/or devices that are connected to the backplane 14.

Chassis 12 generally comprises one or more structures configured to enclose and/or support the internal system components or system devices of the computer system 10. As one example, the chassis 12 includes a plurality of panels that extend about or enclose the backplane 14, the PCBs 16, 18, 20, the peripherals 22, 24 and the modular electrical systems 30, 32. The overall shape, size, and configuration of the chassis 12 depend upon the size, number, and type of system components supported or enclosed by chassis 12 and the intended function or operation of computer system 10.

The backplane 14 is located or housed within chassis 12 and includes a plurality of connectors 40A–40G. In some embodiments, the backplane 14 includes a plurality of both active and passive components connected to the backplane, such as heat generating components 46–48. The connectors 40A–40G comprise conventionally known or future developed connectors or connector portions that are, for example, affixed to a PCB (such as backplane 14) or extend from a PCB (such as backplane 14).

As used herein, a "connector" is any device that provides a conductive pathway for joining electrical circuits or components. The connectors are used, for example, to electrically couple the backplane 14 to PCBs or other electronic components. In one exemplary embodiment, the connectors include two separate components. One component includes a socket (female), and the other component includes a plug (male) that is removably and repeatedly connectable to the socket. Other examples of connectors include, but are not limited to, land grid arrays (LGAs), pin grid arrays (PGAs), pins, cables/wires, soldering, or other removable or disconnectable attachments.

PCBs have a variety of configurations. By way of example, PCBs include a substrate or insulator on which various electronic components and/or heat generating components are placed and electrically connected with plural printed wires or traces. PCBs include, but are not limited to, motherboards (example, boards with connectors for attaching components to a bus), daughterboards (example, boards that attach to another board), expansion boards (example, any board that connects to an expansion slot), controller boards (example, boards for controlling a peripheral device), backplanes, network interface cards (example, boards that enable a computer to connect to a network), power module circuit boards, voltage regulation module (VRM) circuit boards, and video adapters (example, boards that control a graphics monitor).

A motherboard is a printed circuit board that can be used in a personal computer, server, or other electronic device. The motherboard (also known as a main board or system board) can provide attachment points for processors, graphics cards, sound cards, controllers, memory, ICs, modules, PCBs, and many other electronic components and devices in a computing system. The daughterboard can be utilized as an extension of the motherboard or other card or board. The daughterboard can have plugs, sockets, pins, connectors, or other attachments for the motherboard or other boards.

As used herein, a "backplane" is a PCB having connectors into which other PCBs can connect or be plugged. A backplane, for example, can include plural connectors or sockets for expansion cards (i.e., PCBs that are inserted into a computer to provide added capabilities, such as video adapters, internal modems, accelerator boards, sound cards, graphic accelerators, etc.). Further, the term "backplane" includes active backplanes (i.e., capable of computing functions) and/or passive backplanes (i.e., not capable of computing functions).

In one exemplary embodiment, the backplane 14 is supported within and coupled to chassis 12. For purposes of this disclosure, the term "coupled" means the joining of two members directly or indirectly to one another. By way of example, the backplane 14 can be coupled to the chassis using stationary, permanent, removable, releasable, and/or temporary connections.

As used herein, a "peripheral" is an electronic device that is added to a host computer in order to expand capabilities of the host computer. Peripherals can be optional (i.e., not part of the essential computer). Further, peripherals can be internal devices (such as integrated peripherals) or external devices. Examples of peripherals include, but are not limited to, drivers or drives (such as CD-ROM drives and DVD drives), printers, memory, processors, monitors, mouse, keyboard, scanners, and/or other electronic devices that couple to a PCB.

As used herein, a "heat generating device" or "heat generating component" includes any electronic component or device that generates heat during operation. For example, heat generating devices include, but are not limited to, resistors, capacitors, diodes, memories, electronic power circuits, integrated circuits (ICs) or chips, digital memory chips, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range.

FIGS. 2–6 illustrate a modular electrical apparatus or system 100 that includes a cage 102, a PCB or backplane 104, and a plurality of connectors 106A–106H. The modular electrical system can be utilized in a variety of computing or electrical systems, such as computer system 10 of FIG. 1.

The cage 102 includes a retaining or front wall/structure 110 and two supporting or side walls/structures 112. These three structures connect to form the cage 102. In one exemplary embodiment, the cage 102 is constructed of molded polymer.

Figure 4:
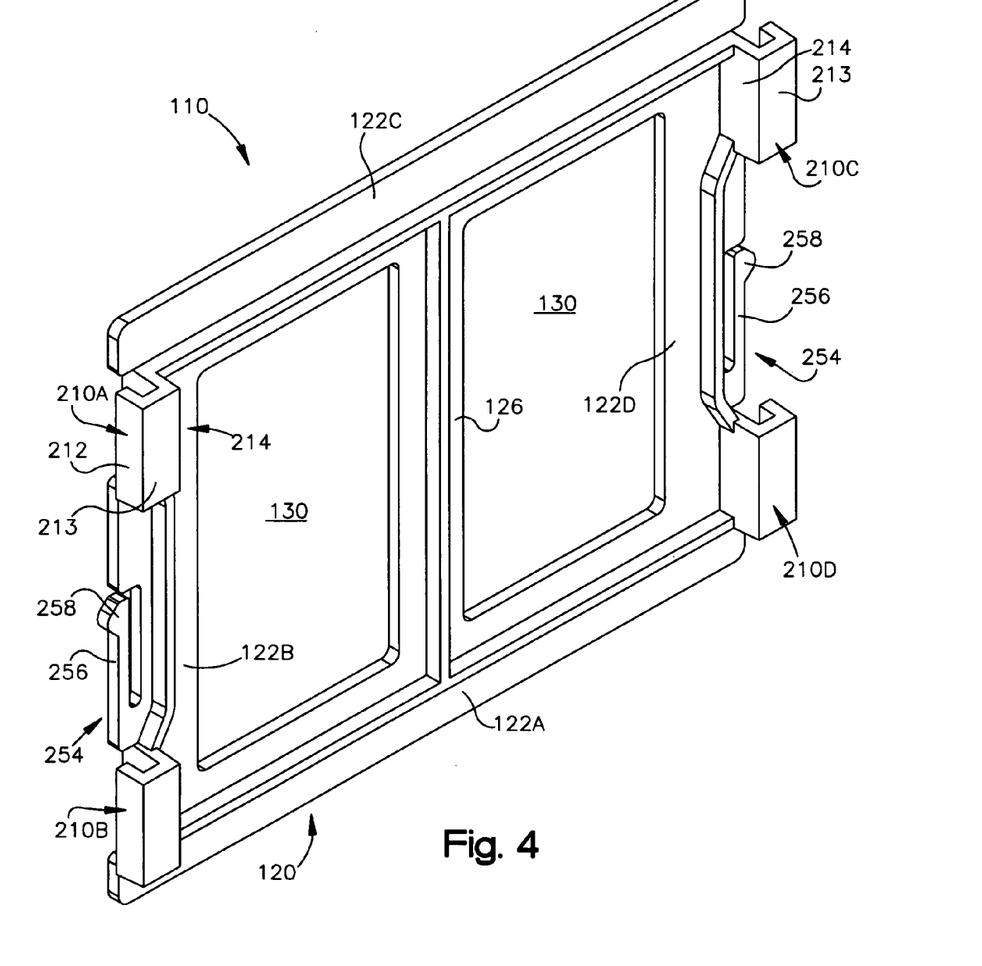
FIG. 4 is a perspective view of an exemplary retaining wall of the cage in accordance with the present invention.

The retaining structure 110 has a generally rectangular or square configuration that includes a perimeter 120. The perimeter comprises four support members 122A–122D. Support members 122A and 122C are oppositely disposed and parallel, and support members 122B and 122D are oppositely disposed and parallel. Ends of respective support members are connected to form the perimeter 120. A support member 126 extends between the perimeter from midpoints of support members 122A and 122C.

In one exemplary embodiment, the retaining structure 110 has holes or openings 130. These openings 130 provide for airflow or air circulation into, out of, and through the cage 102.

Figure 3:
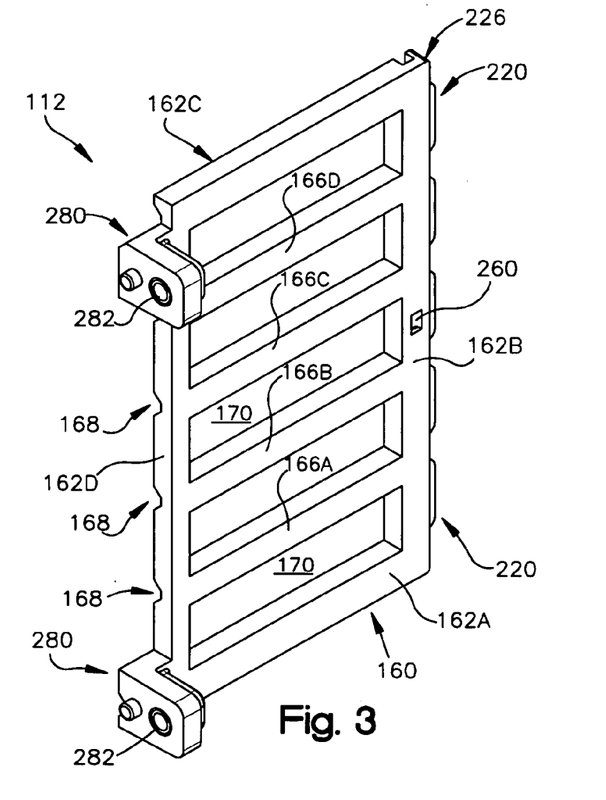
FIG. 3 is a perspective view of an exemplary supporting wall of the cage in accordance with the present invention.

In one exemplary embodiment, the two supporting structures 112 are identically configured. Each supporting structure 112 has a generally rectangular or square configuration that includes a perimeter 160. The perimeter comprises four support members 162A–162D. Support members 162A and 162C are oppositely disposed and parallel, and support members 162B and 162D are oppositely disposed and parallel. Ends of respective support members are connected to form the perimeter 160. Plural support members 166A–166D extend between the perimeter from regular intervals of support members 162A and 162C. In other words, the support members 166A–166D are parallel and evenly spaced apart. Ends of support members 166A–166D are connected to support members 162A and 162C.

In one exemplary embodiment, plural support members have guide rails for receiving and guiding edges of PCBs. For example, support members 162A, 162C and 166A–166D each have an inner surface with a retention feature or guide mechanism 168, such as elongated guide rails or channels. The guide mechanisms 168 can extend along a portion or all of a length of each support member. For example, channels 169 extend along all or substantially all of the length of each support member 162A, 162C and 166A–166D. These channels can have various embodiments, such as, but not limited to, rectangular, rounded, square, or other polygonal or non-polygonal shapes.

In one exemplary embodiment, each supporting structure 112 has holes or openings 170. These openings 170 provide for airflow or air circulation into, out of, and through the cage 102.

The cage 102 includes a guide mechanism 200 for enabling the retaining structure 110 to removably connect with the two supporting structures 112. In one exemplary embodiment, the retaining structure 110 includes a plurality of guide members 210A–210D. Each guide member 210 has an elongated rectangular shape with three walls 212–214. These walls form a channel or slot. As shown, two oppositely disposed support members 122B and 122D have two guide members. Each end of the support member 122B and 122D has a guide member.

The supporting structure 112 includes a plurality of guide members 220. In one exemplary embodiment, the guide members 220 are configured as tabs or extensions that extend outwardly from a side or end surface of the perimeter 160. More specifically, support members 162B have a side surface 226 from the which the guide members project. Each guide member 220 has a rectangular shape with rounded corners on one side.

The guide mechanism 200 enables the retaining structure 110 to be removable from and repeatedly attachable to the supporting structures 112. The guide members 210A–210D are shaped and sized to be received in and slidingly engage with the guide members 220.

Figure 2:
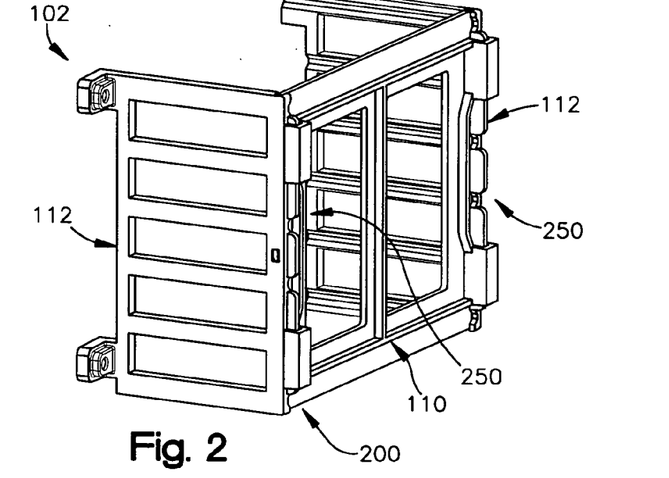
FIG. 2 is a perspective view of an exemplary cage in accordance with the present invention.

Once the retaining structure 110 is positioned between the two opposing supporting structures 112 and respective guide members are engaged, the cage has a rectangular, square, or box-like configuration. Two surfaces are formed from the supporting structure; one surface is formed from the retaining structure; and one surface is formed from the PCB 104 and/or connectors 106A–106F.

The cage 102 includes a locking mechanism 250 for locking the retaining structure 110 to the two supporting structures 112. In a locked configuration, the retaining structure 110 will not inadvertently disconnect from the two supporting structures 112.

The retaining structure 110 includes engaging members 254 that connect to opposing support members 122B and 122D. These engaging members are centrally located on the support members and include a movable or resilient arm 256 with a foot or extension 258 located at one end of the arm 256. Each extension 258 is sized and shaped to be received in a corresponding receiver or opening 260 located on the perimeter 160 of supporting structure 112. In one exemplary embodiment, the opening 260 is a hole that extends through a central location of each support member 162B.

When the retaining structure 110 is in the closed position (see example FIG. 6), the locking mechanism 250 prevents the retaining structure from disengaging with the two supporting structures 112. Each extension 258 is biased into a corresponding opening 260.

In order to close and lock the cage 102, the guide members 210A–210D of the retaining structure 110 slidingly engage the guide members 220 of the supporting structure 112. The extensions 258 snap or lodge into the openings 260 to lock the retaining and supporting structures together.

A mechanical tool is not required to unlock the retaining and supporting structures. Pressure or force applied (for example with a hand or fingers) to the engaging members 254 causes the arms 256 to move inwardly and toward each other. This movement disengages the extensions 258 from corresponding openings 260 so the retaining structure can freely slide or move with respect to the two supporting structures 112. As used herein, a "mechanical tool" is a device (such as an instrument, apparatus, or handheld device) that aids in accomplishing a task.

Figure 5:
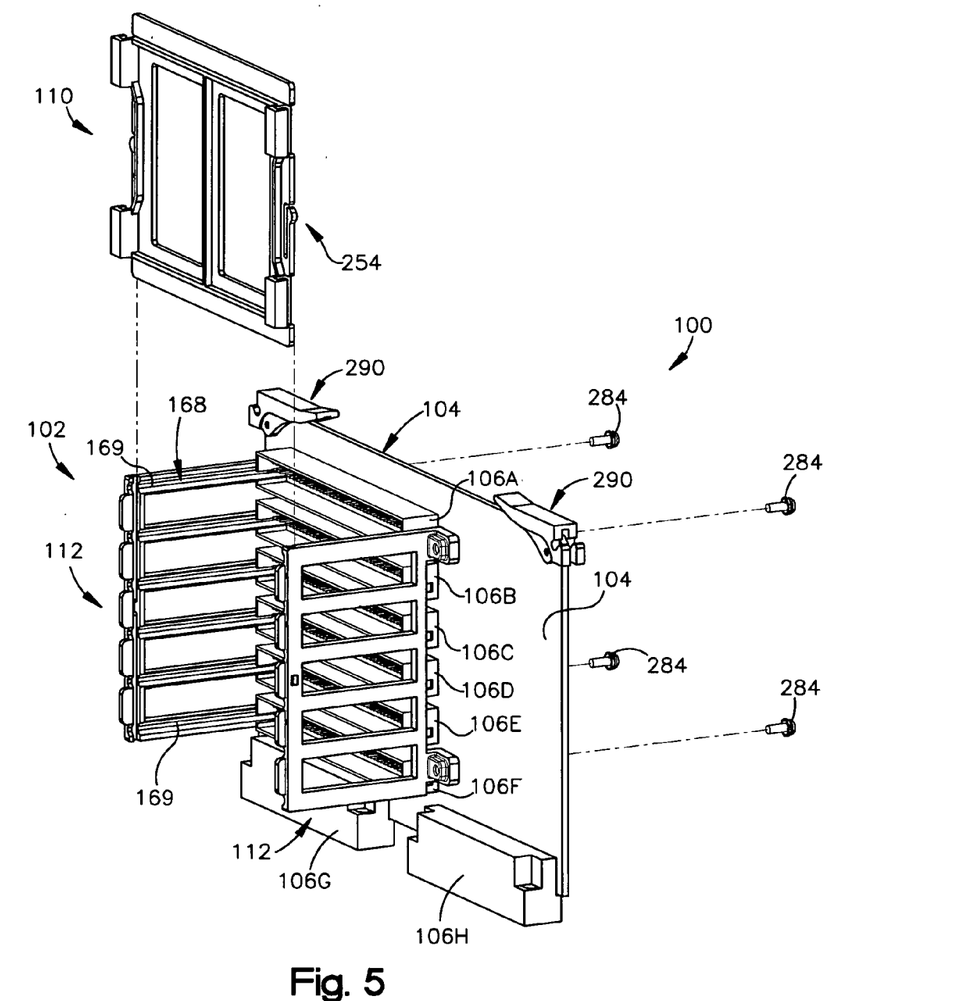
FIG. 5 is a perspective view of an exemplary cage connected to a printed circuit board in accordance with the present invention.

A variety of different embodiments can be used to connect the cage 102 to a PCB. By way of example, each supporting structure 112 includes plural mounting pads 280. The mounting pads 280 are attached to the perimeter 160. For example, the mounting pads 280 are integrally formed at the corners where ends of support member 162D form a junction with ends of support members 162A and 162C. Each mounting pad has a hole 282 for receiving a screw 284. The screws 284 extend into holes located through the PCB 104 to engage threads located inside holes 282.

Figure 6:
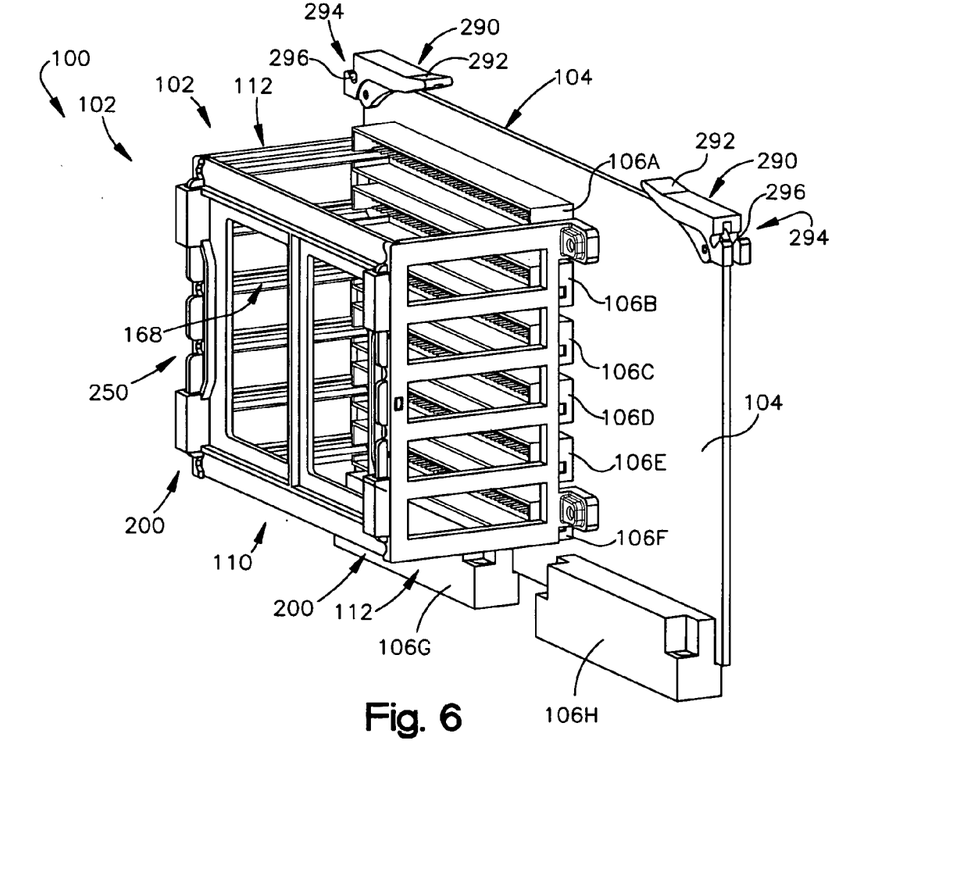
FIG. 6 is another perspective view of an exemplary cage connected to a printed circuit board in accordance with the present invention.

Looking to FIGS. 1 and 6, the modular electrical system 100 is removably connectable to the computer system 10. A mechanical tool is not required to connect or disconnect the modular electrical system 100 from the computer system 10. In this regard, the PCB 104 includes a first end with two connectors 106G and 106H. These connectors are sized and shaped to mechanically and electrically connect or couple with corresponding connectors on PCB 14 (such as connectors 30 and/or 32). Further, the PCB 104 includes a second end (opposite the first end) with two attachment mechanisms 290. Each attachment mechanism 290 includes an arm 292 that is pivotally mounted to the PCB 104. One end of the arm 292 includes a locking mechanism 294 for connecting and locking to the PCB 14 or components attached to the PCB 14. In one exemplary embodiment, the locking mechanism 294 includes an opening or passage 296 for receiving and engaging a pin, rod, or extension. The arm 292 is movable between an open and closed position to engage and disengage the modular electrical system 100 to PCB 14.

As shown best in FIGS. 5 and 6, the modular electrical system 100 includes a plurality of connectors 106A–106H. Some of these connectors are connected to PCB 104 to form one side or wall of cage 102. For example, a plurality of connectors 106A–106F are adjacently disposed in a parallel configuration on the PCB 104. These connectors have a width approximately equal to a width of the retaining structure 110 and a height (when combined) approximately equal to a height of the retaining structure 110.

The connectors 106A–106F are sized and shaped to receive a plurality of PCBs such that the PCBs are housed or retained inside the body of cage 102. The PCBs can be repeatedly connected and disconnected from a connector in the cage without the use of a mechanical tool. As such, a single cage 102 can house a plurality of similar or different stacked, spaced PCBs.

Figure 7:
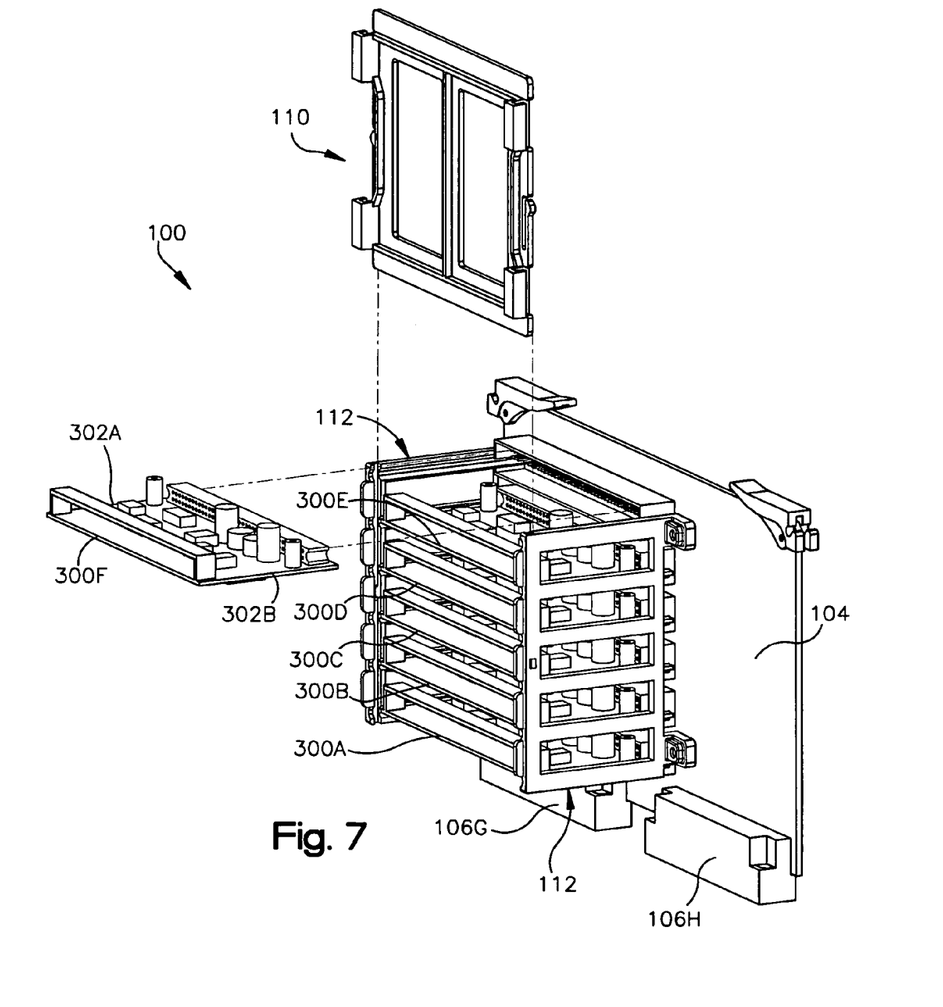
FIG. 7 is a perspective view of an exemplary cage housing multiple printed circuit boards in accordance with the present invention.
Figure 8:
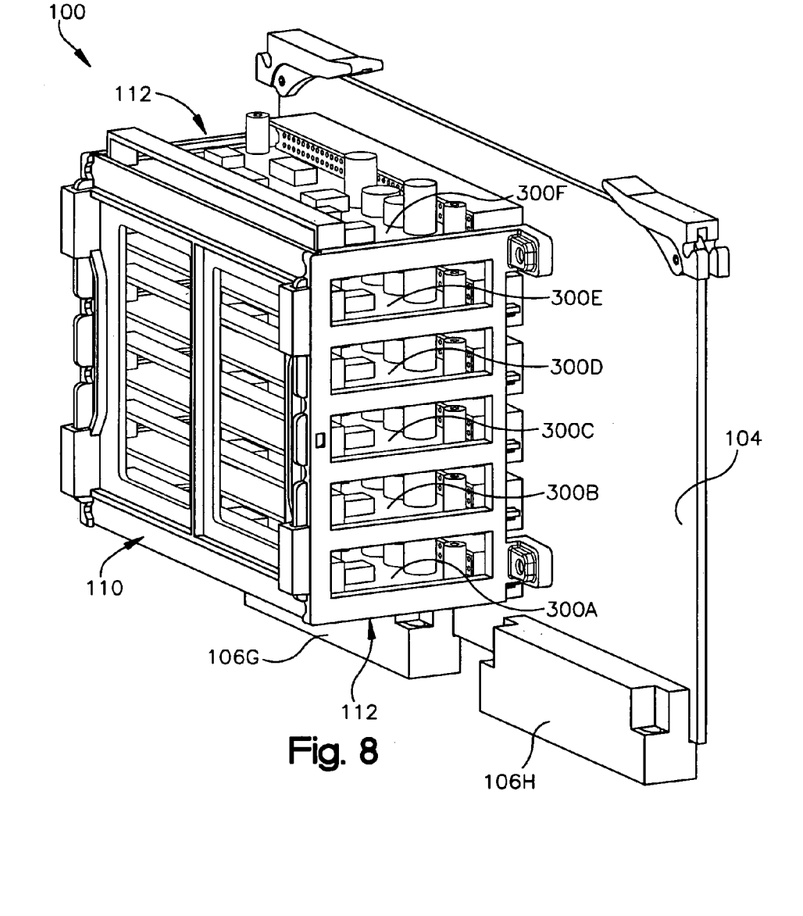
FIG. 8 is another perspective view of an exemplary cage housing multiple printed circuit boards in accordance with the present invention.

FIGS. 7 and 8 show an exemplary embodiment wherein plural PCBs 300A–300F are connectable to a corresponding connector 106A–106F. PCBs 300A–300F include a variety of types and/or configurations. For illustration purposes, the PCBs 300A–300F are described as power boards, cards, or systems; although one skilled in the art will appreciate that other systems and/or PCBs are also within embodiments in accordance with the invention.

The modular electrical system 100 thus includes multiple power supplies or power systems, shown as PCBs 300A–300F. The two electrical connectors 106G and 106H connect the system 100 to PCB 14 (FIG. 1). The power systems 300A–300F are disposed adjacent each other in a horizontally or vertically stacked relationship.

Each power system includes two oppositely disposed edges 302A, 302B. During installation and removal, each edge 302 slidingly engages along a corresponding guide mechanism 168 of supporting structure 112. The edges 302 are sized and shaped to be received in the guide mechanisms 168 so the power system is prohibited from moving in a direction perpendicular to the direction of entry or exit. Further, the edges 302 keep each power system stable and separated from adjacent power systems to maintain a vertical or horizontal stacked and spaced configuration. In one exemplary embodiment, the guide mechanism retains and maintains the plural PCBs within a space or enclosure area defined by the supporting and retaining structures.

The power systems 300A–300F include numerous embodiments for providing power to system 10 and/or PCB 14 (such as heat-generating components 46–48). For example, the power system can be a factorized power architecture (FPA) module, a power converter, such as a direct current (DC) converter or DC—DC converter, AC-DC converter, DC linear regulator, DC switching regulator, or DC charge pump.

In one exemplary embodiment, the power systems 300A–300F are redundant power systems. Redundant power systems can serve as a duplicate for preventing failure upon failure of one of the power systems. In other words, if one power system fails, then the other power system can supply sufficient power to the system to continue operation of the system. As an example, if power system 300A fails, then power systems 300B–300F could provide sufficient power to the system 10 and/or PCB 14.

The power systems 300A–300F are also modular and replaceable. In some embodiments, each power system is an independently-operable unit/PCB that can be constructed with standardized units or dimensions for flexibility and replaceability for use in the systems 10 and/or 100. Further, each power system can be connected to or removed from the cage 102 without connecting, removing, or replacing other power systems in the cage 102. By way of illustration, suppose for example that power system 300A fails or otherwise needs replaced or upgraded. The locking mechanism 250 is disengaged, and retaining structure 10 is removed from cage 102. Thereafter, power system 300A is disconnected from connector 106A and removed from cage 102. A new power system is placed in the cage 102 and connected to connector 106A. The retaining structure 110 is re-engaged with the supporting structure 112, and the locking mechanism 250 is engaged.

Further, the power systems can be disconnected and connected independent of each other and support hot-swapping (i.e., the ability to add and remove devices to and from a computer or electronic device while the computer or electronic device is running with the operating system automatically recognizing the changed or newly added component).

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

Embodiments in accordance with the invention are not limited to any particular number of PCBs (such as PCBs or power systems 300A–300F). Further, the PCBs are stackable in a variety of configurations, such as vertically or horizontally stacked.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. A cage for housing plural printed circuit boards, comprising:
    first and second side walls oppositely disposed and connected to a printed circuit board (PCB), each side wall having plural guide mechanisms for receiving and guiding edges of plural PCBs into the cage; and
    a front wall having a guide mechanism for receiving and slidingly engaging with the first and second side walls, wherein the first, second, and front walls form an enclosure for housing the plural PCBs in a stacked configuration, wherein the PCB forms a back wall for the cage, and the first and second side walls are separated from each other while connected to the PCB.

2. The cage of claim 1, wherein the first, second, and front walls each have plural openings for passage of airflow into and out of the cage.

3. The cage of claim 1, wherein the plural guide mechanisms include parallel channels that are formed in an inner side of the first and second side walls.

4. The cage of claim 1, wherein the first and second side walls have first ends that connect to the PCB and second ends, opposite the first ends, that include a plurality of extensions for slidingly engaging with the guide mechanism of the front wall.

5. The cage of claim 1, wherein the front wall is attachable to and removable from the first and second side walls without the use of a mechanical tool.

6. The cage of claim 1, wherein the cage is formed from polymer.

7. The cage of clam 1, wherein the first and second walls each include plural spaced and parallel support members, each support member including a guide rail for slidingly engaging one of the plural PCBs.

8. A cage for enclosing plural printed circuit boards, comprising:
    first and second supporting structures oppositely disposed on and connected to a printed circuit board (PCB), each supporting structure having plural mechanisms for guiding and retaining plural stacked PCBs enclosed in the cage; and
        a front retaining structure removably connected to the first and second supporting structures to form an enclosure for the plural stacked PCBs, wherein the front retaining structure includes a locking mechanism for engaging to and disengaging from the first and second supporting structures without use of a mechanical tool, wherein the first and second supporting structures and the front retaining structure each have plural openings to provide airflow through the cage, the PCB forms a back wall for the cage, and the first and second supporting structures are separated from each other while connected to the PCB.

9. The cage of claim 8, wherein the locking mechanism includes a resilient arm that releasably engages an opening in the first and second supporting structures.

10. The cage of claim 8, wherein the locking mechanism snap connects the front retaining structure to the first and second supporting structures.

11. The cage of claim 8, wherein the locking mechanism includes a biasing member to lock the front retaining structure to the first and second supporting structures.

12. The cage of claim 8, wherein the front retaining structures forms one side of the cage, the first and second supporting structures form two other sides of the cage, and plural stacked connectors connected to the PCB form a fourth side of the cage.

13. The cage of claim 8, wherein the cage has a rectangular box shape with at least two sides without walls.

14. The cage of claim 8, wherein a first backplane forms one side of the enclosure, and the cage and backplane are removably connectable to a second backplane of a computer system.

15. The cage of claim 8, wherein the first and second supporting structures each comprise plural parallel spaced support members that each have a retention feature for retaining a PCB inside the cage.

16. A method for enclosing plural printed circuit boards in a cage, comprising:
    connecting two oppositely disposed sidewalls to a backplane having plural adjacent connectors arranged between the sidewalls, the backplane forming a back wall for the cage;
    sliding plural printed circuit boards (PCBs) against the sidewalls to guide and connect the plural PCBs with the plural connectors;
    sliding a front wall against the sidewalls to lock the front wall and the sidewalls together and retain the plural PCBs in a stacked configuration between the sidewalls and within the cage; and
    providing the two sidewalls and the front wall with plural openings to circulate air through the cage, the sidewalls being separated from each other while connected to the backplane.

17. The method of claim 16 further comprising actuating, with force from a hand, a resilient member to unlock the font wall from the sidewalls.

18. The method of claim 16 further comprising sliding the front wall against the sidewalls to remove the front wall from the sidewalls.

19. The method of claim 16 further comprising stacking the plural PCBs in a parallel spaced relationship within the cage.

20. The method of claim 16 further comprising attaching and detaching, without the use of a mechanical tool, the cage enclosing the plural stacked PCBs to a backplane of a computer system.

* * * * *